US 6,639,866 B2

(12) United States Patent
Slamowitz et al.

(10) Patent No.: US 6,639,866 B2
(45) Date of Patent: Oct. 28, 2003

(54) VERY SMALL SWING HIGH PERFORMANCE ASYNCHRONOUS CMOS STATIC MEMORY (MULTI-PORT REGISTER FILE) WITH POWER REDUCING COLUMN MULTIPLEXING SCHEME

(75) Inventors: Mark Slamowitz, Chandler, AZ (US); Douglas D. Smith, Mesa, AZ (US); David W. Knebelsberger, Tempe, AZ (US); Myron Buer, Gilbert, AZ (US)

(73) Assignee: Broadcom Corporation, Irvine, CA (US)

(*) Notice: Subject to any disclaimer, the term of this patent is extended or adjusted under 35 U.S.C. 154(b) by 21 days.

(21) Appl. No.: 10/012,858

(22) Filed: Nov. 3, 2001

(65) Prior Publication Data

US 2002/0125585 A1 Sep. 12, 2002

Related U.S. Application Data

(60) Provisional application No. 60/245,913, filed on Nov. 3, 2000.

(51) Int. Cl.$^7$ ................................................. G11C 8/00
(52) U.S. Cl. ............. 365/230.05; 365/154; 365/189.07; 365/207
(58) Field of Search .......................... 365/154, 230.05, 365/207, 189.07

(56) References Cited

U.S. PATENT DOCUMENTS

| | | | | |
|---|---|---|---|---|
| 4,580,245 A | | 4/1986 | Ziegler et al. ............... 365/154 |
| 4,843,264 A | * | 6/1989 | Galbraith .................... 365/154 |
| 4,933,899 A | * | 6/1990 | Gibbs ......................... 365/154 |
| 5,260,908 A | * | 11/1993 | Ueno .......................... 365/154 |
| 5,477,489 A | * | 12/1995 | Wiedmann ................... 365/154 |
| 5,590,087 A | | 12/1996 | Chung et al. ........... 365/230.05 |
| 5,608,681 A | | 3/1997 | Priebe et al. ................ 365/207 |
| 5,640,356 A | | 6/1997 | Gibbs ......................... 365/207 |
| 6,222,777 B1 | * | 4/2001 | Khieu ......................... 365/154 |

FOREIGN PATENT DOCUMENTS

JP          09186535       7/1997

\* cited by examiner

*Primary Examiner*—Tan T. Nguyen
(74) *Attorney, Agent, or Firm*—McAndrews, Held & Malloy, Ltd.

(57) ABSTRACT

The present invention relates to a multi-port register file memory or SRAM including a plurality of storage elements and other circuitry that operate synchronously or asynchronously. The storage elements are arranged in rows and columns and store data. Two read port pairs are coupled to each of the storage elements and a differential sensing device or circuit. The read port is coupled to the storage elements in an isolated manner, enabling a plurality of cells to be arranged in such rows and columns. The sensing device is adapted to sense a small voltage swing. A column mux circuit is coupled to each column and the sensing device. Performance is not degraded unusually as the power supply voltage is reduced due to bus drop or inductive effects.

25 Claims, 14 Drawing Sheets

VERY SMALL SWING HIGH PERFORMANCE ASYNCHRONOUS CMOS STATIC MEMORY (MULTI-PORT REGISTER FILE) WITH POWER REDUCING COLUMN MULTIPLEXING SCHEME

CROSS REFERENCE TO RELATED APPLICATIONS

This application is related to, and claims benefit of and priority from, Provisional Application No. 60/245,913 filed Nov. 3, 2000, titled "Very Small High Performance CMOS Static Memory (Multi-Port Register File) With Power Reducing Column Multiplexing Scheme", the complete subject matter of which is incorporated herein by reference in its entirety.

FEDERALLY SPONSORED RESEARCH OR DEVELOPMENT

[Not Applicable]

BACKGROUND OF THE INVENTION

One embodiment of the present invention relates to static memories or multi-port register files. More specifically, one embodiment of the present invention relates to very small swing high performance asynchronous CMOS static memory having a column multiplexing scheme.

Currently, memories or register files are widely used in numerous applications in various industries. Although, typically it is desirable to incorporate as many memory cells as possible into a given area, some known memories or register files are often perceived as physically too large (i.e., they take up too much silicon area) and/or are too slow for a given product definition. In addition, power dissipation is another parameter that all memory designers are forced to consider in order to make a product cost effective. Additionally, some applications demand that such memories or register files function synchronously or asynchronously.

One type of basic storage memory or register file is the CMOS static random access memory (alternatively referred to as the "SRAM"), which retains its memory state without refreshing as long as power is supplied to the cell. In one embodiment of a SRAM, the memory state is usually stored as a voltage differential within a bistable functional element such as an inverter loop. However, some currently known SRAM memories don't work in conjunction with low supply voltages. That is, as the supply voltage approaches about 1.0 volt or less, the access time increases exponentially. Moreover, such currently known SRAM memories are susceptible to noise. That is noise may be present, on a bitline for example, and may false trip one or more associated devices such as sense amplifiers.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in a high performance CMOS static memory. In one embodiment, the present invention may be found in a differential high speed CMOS static memory that operates synchronously or asynchronously with a low power supply voltage. In this embodiment, the CMOS static memory has a read access time of about 3 nanoseconds or less, and is more robust than currently known static memories, eliminating noise effects that may falsely trip a sense amplifier used with the static memory.

One embodiment of the present invention relates to a multi-port register file memory adapted to be used in applications where a power supply of less than about 1.08 volts occurs. In this embodiment, the memory includes at least one memory cell, a differential sensing device coupled to a voltage reference device and adapted to sense a small voltage swing. This embodiment also includes a latched output circuit coupled to the differential sensing device.

In another embodiment, the register file memory relates to a multi-port register file memory adapted to be used in applications where a power supply of less than about 1.08 volts occurs. In this embodiment, the memory comprises a plurality of memory cells arranged in a plurality of rows and columns. The memory further includes at least one read port and one write port coupled to each of the storage elements. A differential sensing device is included which is adapted to sense a small voltage swing. This device also includes a voltage reference and latched output circuit which are coupled to the differential sensing device.

In yet another embodiment, the present invention relates to a multi-port register file memory, where the memory includes a plurality of memory cells arranged in rows and columns, a means for selecting one or more of the memory cells, and a means for sensing a small bitline voltage swing.

Yet another embodiment of the present invention relates to a method for improving speed and increasing performance in a multi-port register file memory having a plurality of storage elements. In this embodiment, the method includes selecting at least one of the memory cells, and differentially sensing a small voltage swing.

Yet still another embodiment of the present invention relates to a method for reading data stored in a multi-port register file memory having a plurality of memory cells arranged in rows and columns. This embodiment includes selecting one of the memory cells, flowing a current through at least one read transistor pair of a memory cell in one (or possibly more) column(s), causing an output (of a sense amplifier connected to at least one column) to switch accessed data to full CMOS logic levels.

Other aspects, advantages and novel features of the present invention, as well as details of an illustrated embodiment thereof, will be more fully understood from the following description and drawings, wherein like numerals refer to like parts.

DETAILED DESCRIPTION OF THE INVENTION

One embodiment of the present invention relates to a high speed, high density differentially sensing register file memory or SRAM that operates synchronously or asynchronously with a low voltage power supply. It is contemplated that this embodiment reduces or eliminates noise effects on the bitlines, is more robust, uses less circuits, and takes up less space than currently known SRAMS.

In one embodiment, the register file memory or SRAM has improved power dissipation (i.e., moderate) used in the 64 kb (kilo bit) or smaller range with a power supply voltage greater than 0 but less than about 2.00 volts, for example. The register file memory may, in one embodiment, be a uni-directional multi-port memory (i.e., having dedicated write port(s) and dedicated read port(s) using a differential two-stage analog-style sense amp to sense a small bitline swing, about 100 millivolts (differentially) for example, located at the top rail of the voltage source. This register file memory is generally used in applications in the 16 kb or smaller range with a power supply voltage which could be less than about 1.08 volts dissipating only 30 milliwatts of power (worst case) for a 128 channel configuration for example. This register file memory reduces read access time to about 3 nanoseconds or less, may be considered more robust than previously known SRAM's, and eliminates noise effects on the bitlines that may falsely trip the sense amplifier.

Figure 1:
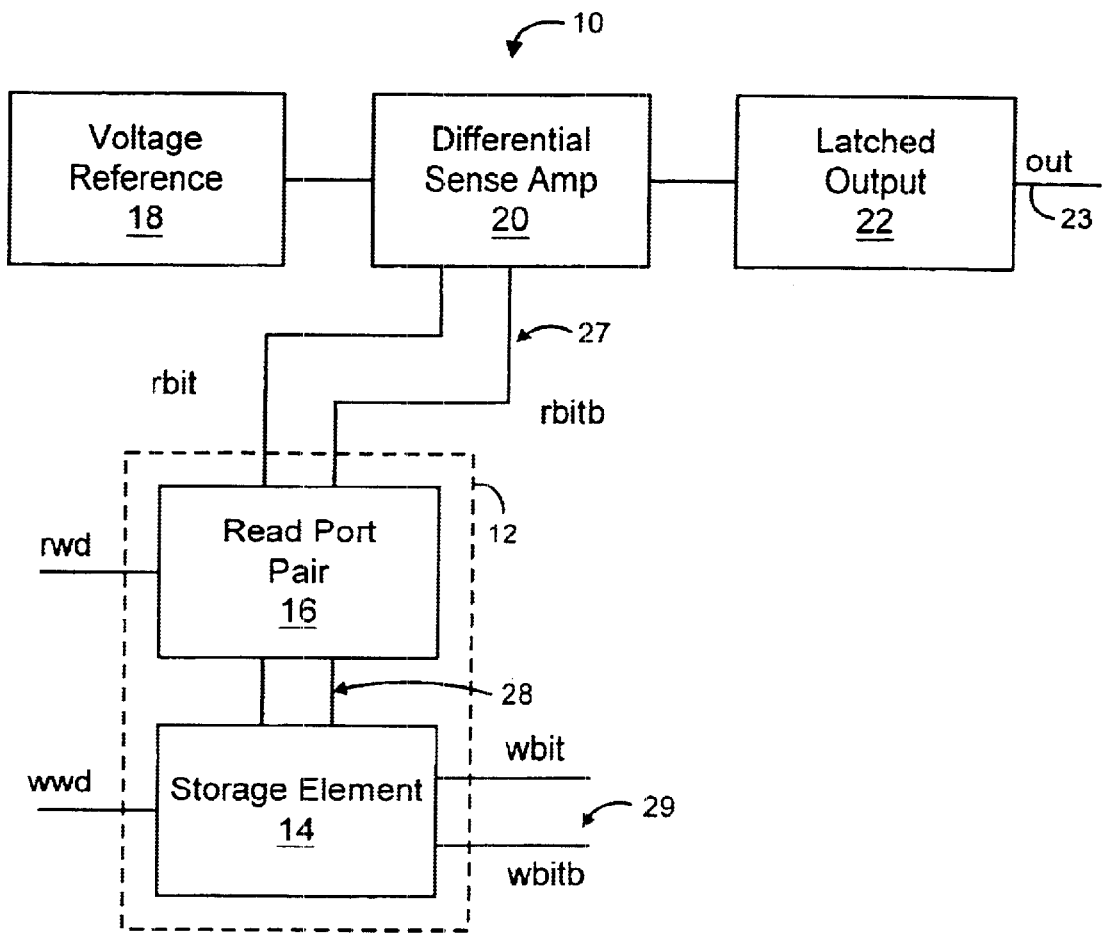
FIG. 1 illustrates a block diagram of a high performance asynchronous CMOS static memory (multi-port register file) in accordance with one embodiment of the present invention.
Figure 2:
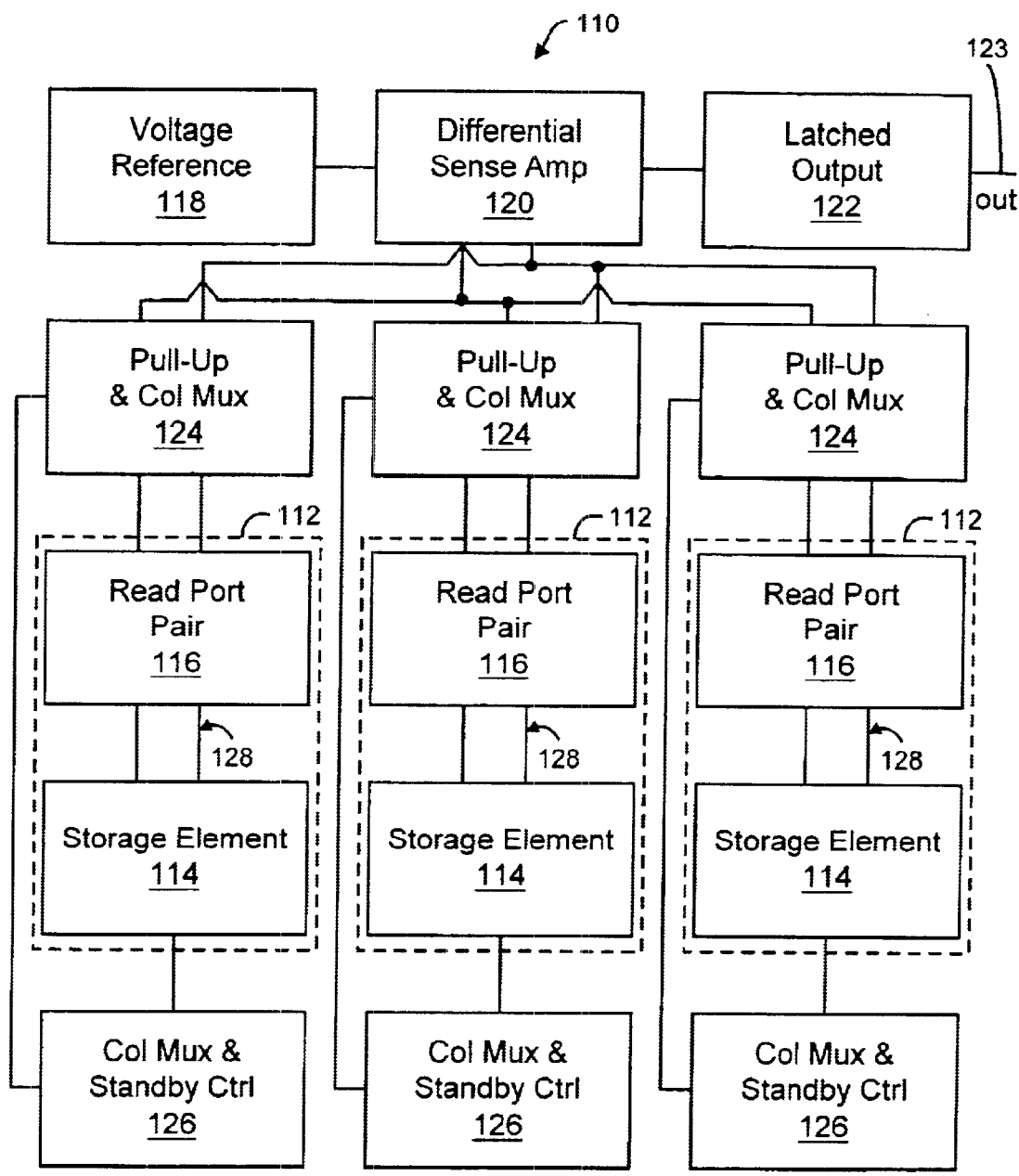
FIG. 2 illustrates a block diagram of an alternate embodiment of a high performance asynchronous CMOS static memory (multi-port register file) including a column mux in accordance with one embodiment of the present invention.

A block diagram of two embodiments of the present invention are illustrated in FIGS. 1 and 2. The CMOS static memory or multi-port register file memory, generally designated memory 10 and 110 in FIGS. 1 and 2 respectively, operates either synchronously or asynchronously and includes, for example, a register file memory cell 12 or 112 coupled to, connected to or otherwise electrically communicating directly or indirectly with a sense device or amplifier 20 or 120 (as illustrated in FIGS. 1 and 2) although other arrangements are contemplated. The memories 10 and 110 store data (i.e., "words" and "bits per word") provided, for example, during a write process. The sense device or amplifier 20 and 120 sense a small bitline voltage swing, increasing performance of the memories 10 and 110 respectively.

As illustrated in FIG. 1, the register file memory cell 12 comprises a read port pair 16 coupled to a storage element 14. Differential sense amp 20 is coupled to the register file memory cell 12. More specifically sense amp 20 is coupled to the read port pair 16. The voltage reference 18 is coupled to the differential sense amp 20, which in turn is coupled to the latched output circuit 22 having output 23. The sense amp 20 differentially senses a small bitline swing output by the read port pairs. In other words, sense amp 20 effectively senses a differential current on the local read bitlines rbit and rbitb, 27.

FIG. 1 further illustrates a plurality of electrical connections or couplings. Electrical couplings wwd (write wordline), write bitlines (alternatively referred to as wbit and wbitb, 29) are shown coupled to storage element 14. Storage element 14 is coupled to read port pair 16 via couplings or connections 28. Rwd (read wordline) is illustrated coupled to read port pair 16. In this embodiment, the memory 10 has no column mux (i.e., where each column is coupled to its own output channel), so read port pair 16 is coupled directly to the sense amp 20 via local read bitlines (alternatively referred to as rbit and rbitb, 27). Out or output line 23 is illustrated coupled or connected to latched output circuit 22.

The memory cells are, in one embodiment, arranged in a plurality of rows and in at least one column, with each column coupled to a single output channel, storing recorded information. The read port pairs are coupled to the storage elements in an isolated manner (i.e., the read port pairs don't affect the static stability of the register file memory cell 12), enabling a plurality of memory cells to be arranged in such plurality of rows and in one (or more) columns, storing the recorded information.

In one embodiment of the present invention, the memory state is stored as a voltage differential within a bistable storage element 14 such as an inverter loop. These storage devices are either in a low or high stored memory state. If the storage device is in a low stored state, recording new and opposite information changes the storage device to a high stored state (logic "0" to logic "1" respectively). If the storage device is in a high stored state (logic 1), recording new and opposite information changes the storage device to a low stored state (logic 0).

In this embodiment, the presence or lack of a current at the sense amplifier 20 determines the state contained within the selected memory location. The sense amplifier 20 differentially senses the rbit and rbitb bitlines and outputs a corresponding voltage in order to communicate with the memory's output storage which requires full CMOS logic level input. The sense amplifier senses a small predetermined bitline swing, say about 100 millivolts located at the top rail of the voltage supply for example. Having a small, predetermined bitline swing reduces the amount of time required to fully switch the highly capacitive bitlines. The bitline swing is at least a portion of the total voltage supply. Even with such a small bitline swing, it is sufficient for the two-stage sense amplifier to almost fully restore standard CMOS logic levels at the output of the sense amplifier.

A block diagram of another embodiment of the present invention is illustrated in FIG. 2. The memory 110 illustrated in FIG. 2 includes a plurality of memory cells 112 each memory cell 112 comprising a read port pair 116 and a storage element 114. Each memory cell 112 is coupled to, connected or otherwise electrically communicates with a pull-up & column mux 124 and a column mux standby control 126. Additionally, the pull-up & column mux 124 is coupled to the column mux & standby control 126. Memory 110 also includes a voltage reference 118, which is coupled to each of the differential sense amps 120 for setting a constant current, which in turn is coupled to the latched output circuit 122 having an output 123. The sense amp 120 differentially senses a small bitline swing output by the read port pairs. In other words, sense amp 120 effectively senses a current by converting it to a voltage on the local read bitlines rbit and rbitb.

While not specifically illustrated in FIG. 2, it is contemplated that memory 110 includes electrical couplings wwd, wbit, wbitb, rwd, rbit, and rbitb similar to the embodiment illustrated in FIG. 1. Couplings 128 and out 123 are illustrated. The storage elements are, in one example of this embodiment, arranged in a plurality of N rows and a plurality of M columns and store the recorded information. In FIG. 2, N=1 and M=3 for example. Again, in this example, the read port pairs 116 are coupled to the register file storage element 114 in an isolated manner, so that the read ports don't affect the static stability of the memory cell.

As provided previously, the presence or lack of a current at the sense amplifier 120 determines the data state stored in the selected memory location. The sense amplifier 120 senses or detects the current and outputs a corresponding voltage in order to communicate with the memory's full CMOS output stage.

In one example of the embodiment illustrated in FIG. 2, a plurality of columns (configured as a multi-column mux register file memory) is contemplated as provided previously. Column muxing optimizes memories with many words but with relatively few bits per word. From both a topological as well as a performance perspective, column muxing provides flexible embedded memory solutions. A pullup & column mux circuit (best viewed in FIG. 8) is used to implement such column muxing capability. This circuit is located conceptually between the register file memory cell 112 and the sense amplifier 120. As should be apparent from the previous discussion and the figures, the number of column mux circuits is generally dependent on the number of columns and the number of bits per word.

Figure 3:
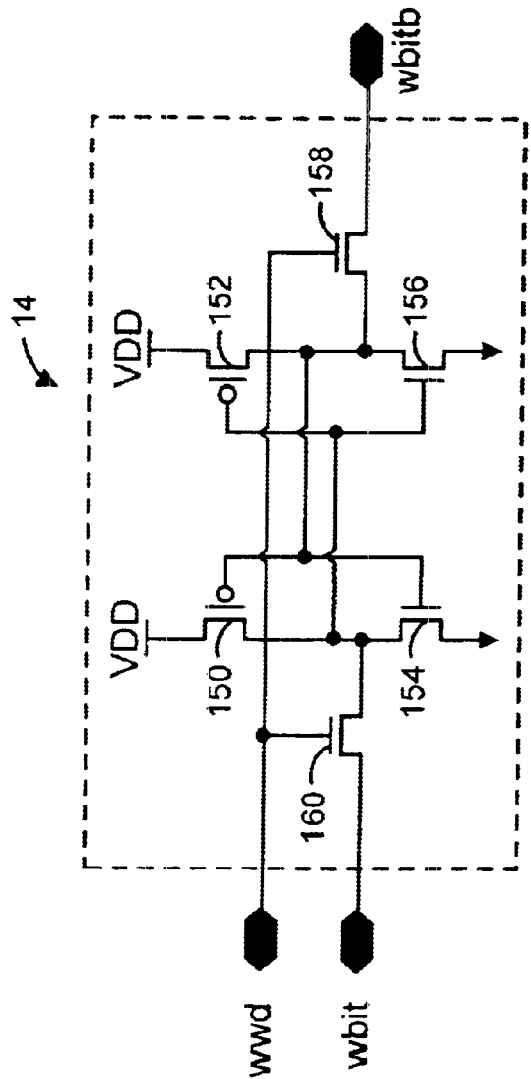
FIG. 3 illustrates one example of a storage device used in accordance with one embodiment of the present invention.

The embodiments of FIGS. 1 and 2 reduce memory silicon area while improving speed in comparison to known SRAM memories or register files. Use of dedicated write and read ports in combination with differential two-stage sense amplifier(s) eliminates duplicate voltage circuits and/or reduces overall transistor count in the memory 10 and 110 resulting in a reduced amount of required silicon area. The illustrated embodiment also optimizes memory read access time as the high transistor density translates to less interconnect capacitance and hence higher speed for a given or specific power level. Referring to FIG. 3, one embodiment of the storage element 14 is illustrated, a 6T CMOS SRAM storage element for example. The 6T CMOS SRAM storage device comprises two P channel field-effect transistors (Pfets) 150 and 152 and four N channel field-effect transistors (Nfets) 154, 156, 158 and 160. A Pfet transistor is turned on by a logic 0 at its gate and is adapted to pass or transmit a logic 1. An Nfet transistor is turned on by a logic 1 at its gate and is adapted to pass or transmit a logic 0.

It should be appreciated that the storage device is either in a low or high stored memory state as provided above. If logic 0 is stored (i.e., storage device is in a low stored state) recording new and opposite information stores logic 1 (i.e., a high stored state). If a logic 1 is recorded on storage device (i.e., storage device is in a high stored state) recording new and opposite information records a logic 0 (i.e., changes the storage element data to a low stored state).

Figure 4:
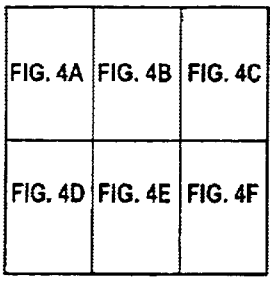
FIG. 4, comprising partial views 4A, 4B, 4C, 4D, 4E and 4F, illustrates a circuit diagram of a high performance asynchronous CMOS static memory (multi-port register file) including pull up and column muxes similar to that illustrated in FIG. 2 in accordance with one embodiment of the present invention.
Figure 4A:
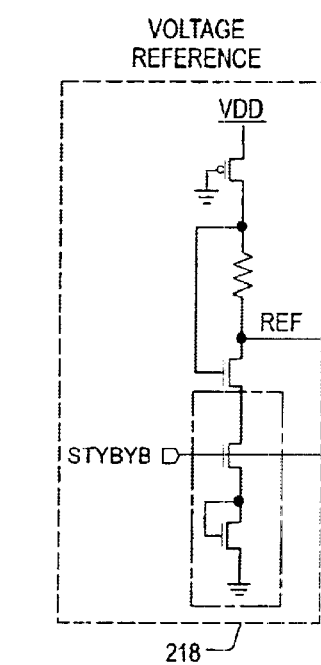
Figure 4A:
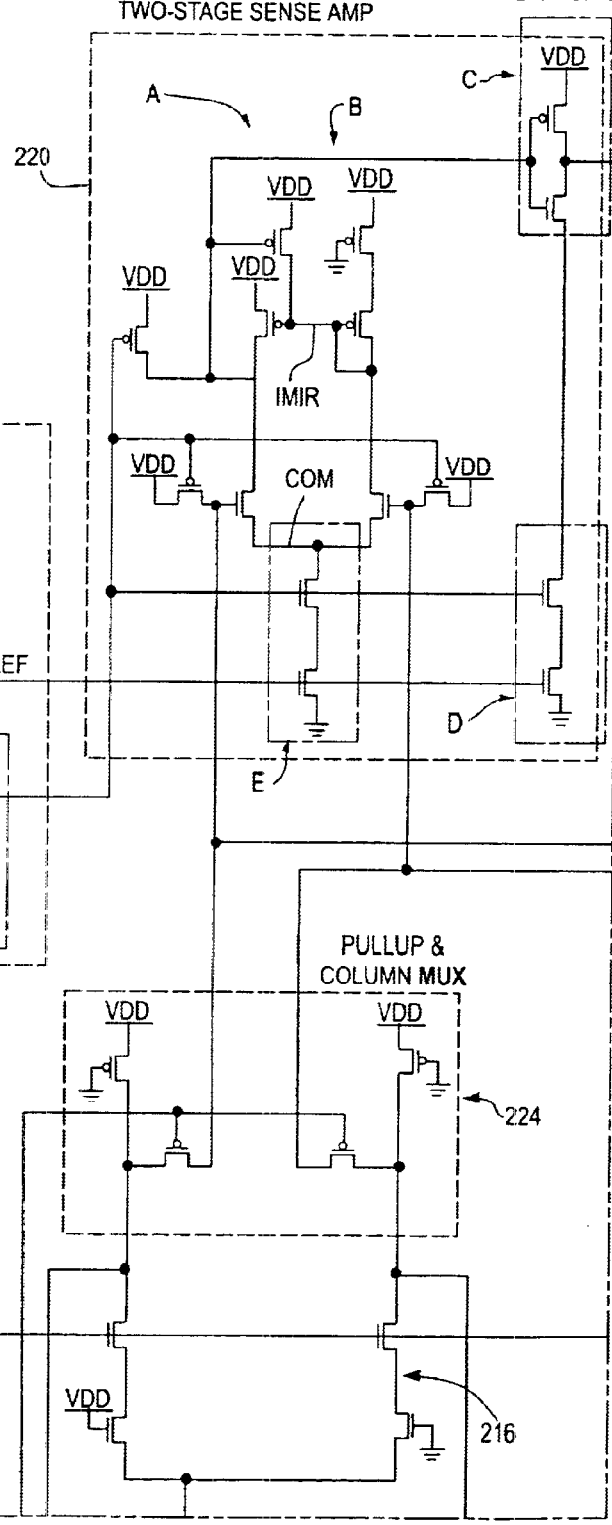
Figure 4B:
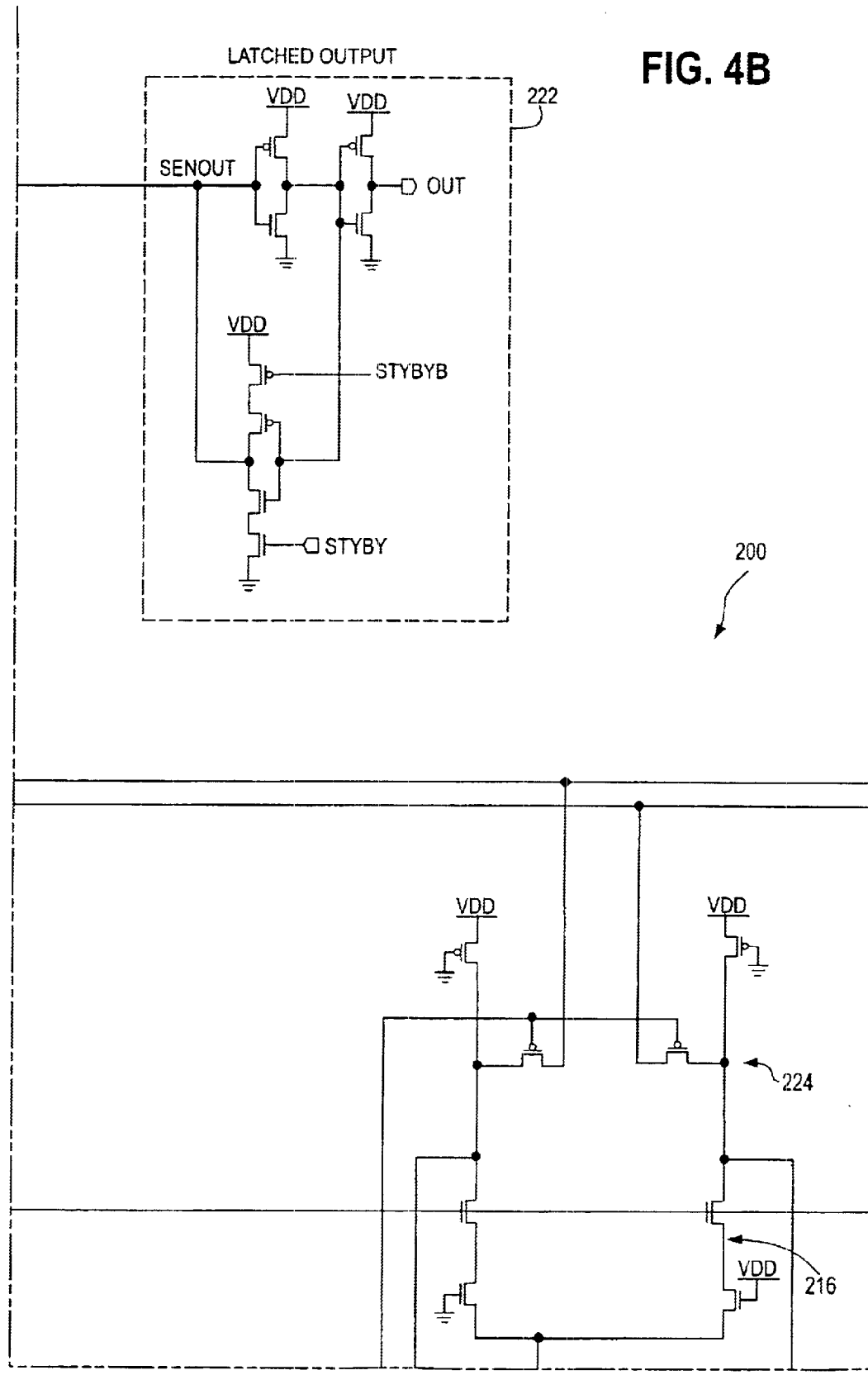
Figure 4C:
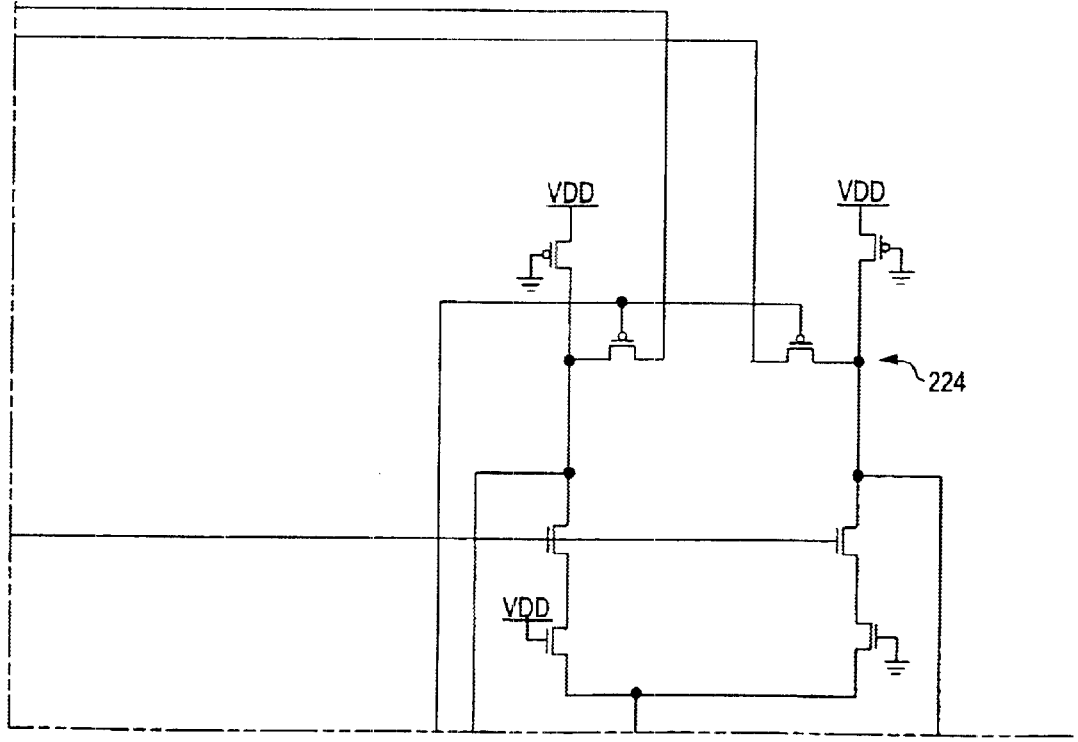
Figure 4D:
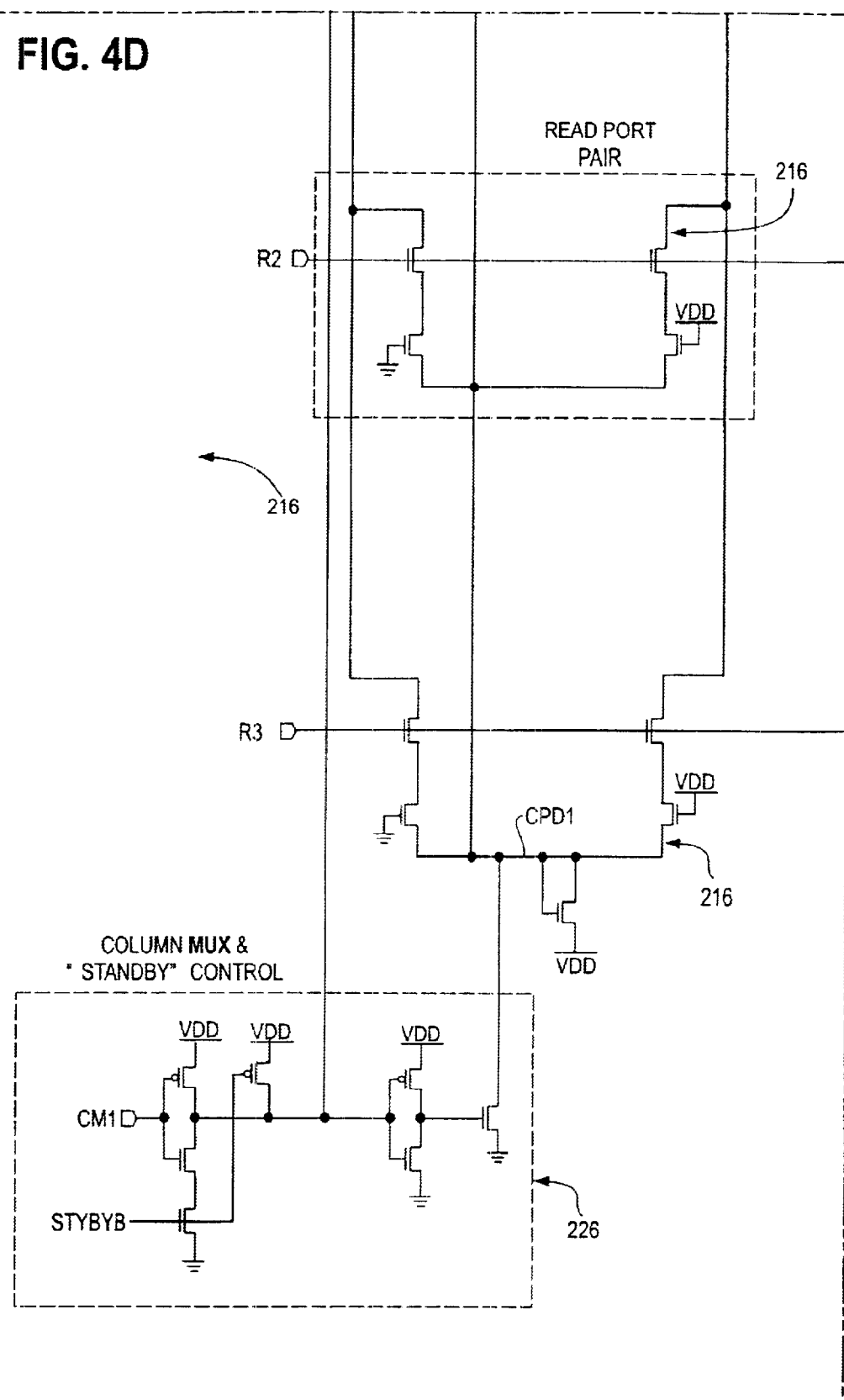
Figure 4E:
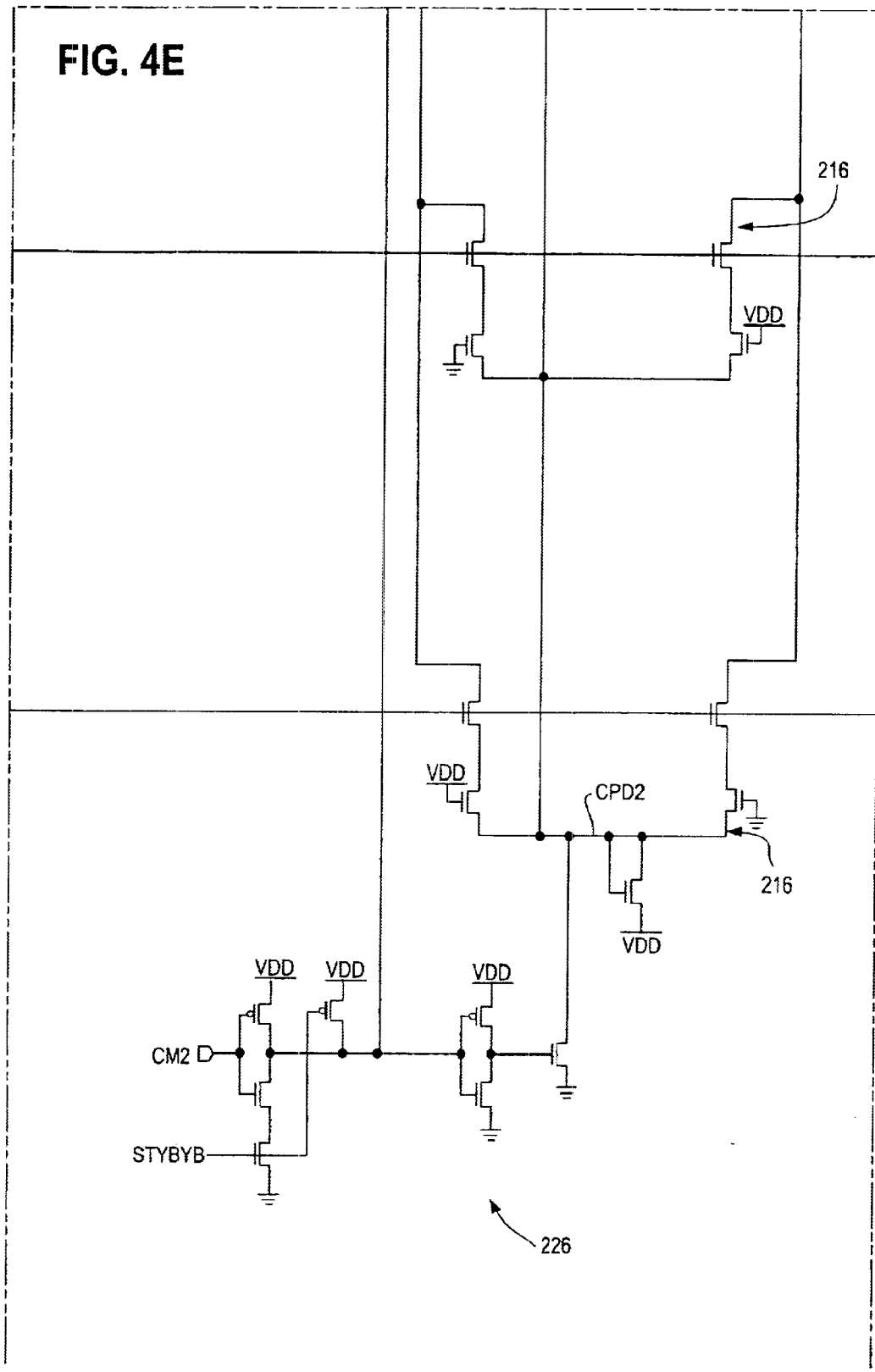
Figure 4F:
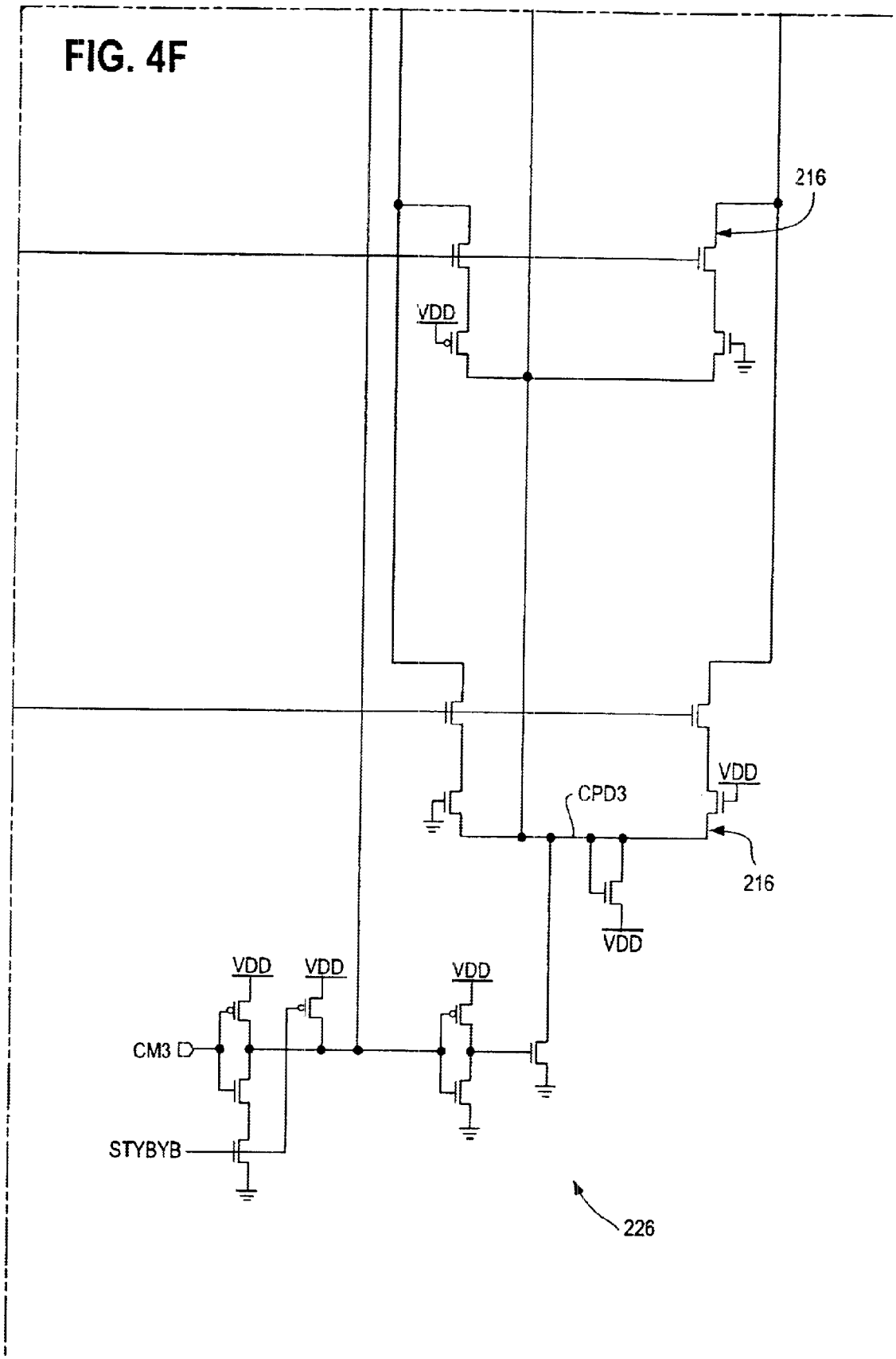

A circuit diagram of SRAM or multiport register file 200 similar to memory 110 in FIG. 2 is illustrated in FIG. 4, comprising partial views 4A, 4B, 4C, 4D, 4E and 4F. The illustrated embodiment provides improved power dissipation (i.e., moderate) used in the 64 kb (kilo bit) or smaller range with a power supply voltage greater than 0 but less than about 2.00 volts, for example. The register file memory may, in one embodiment, be used in applications in the 16 kb or smaller range with a power supply voltage which could be less than about 1.08 volts without sacrificing significant speed from that typically expected, dissipating only 30 milliwatts of power (worst case) for a 128-channel configuration, for example. In this embodiment, the register file memory 200 reduces read access time to about 3 nanoseconds or less, is more robust than previously known SRAM's and eliminates the noise effects on the bitlines that may falsely trip the sense amplifier. In the illustrated embodiment, register file 200 comprises read port pair 216, pull-up & column mux 224, column mux & standby control 226, voltage reference 218, differential analog-style two-stage sense amp 220 and latched output circuit 222.

Figure 5:
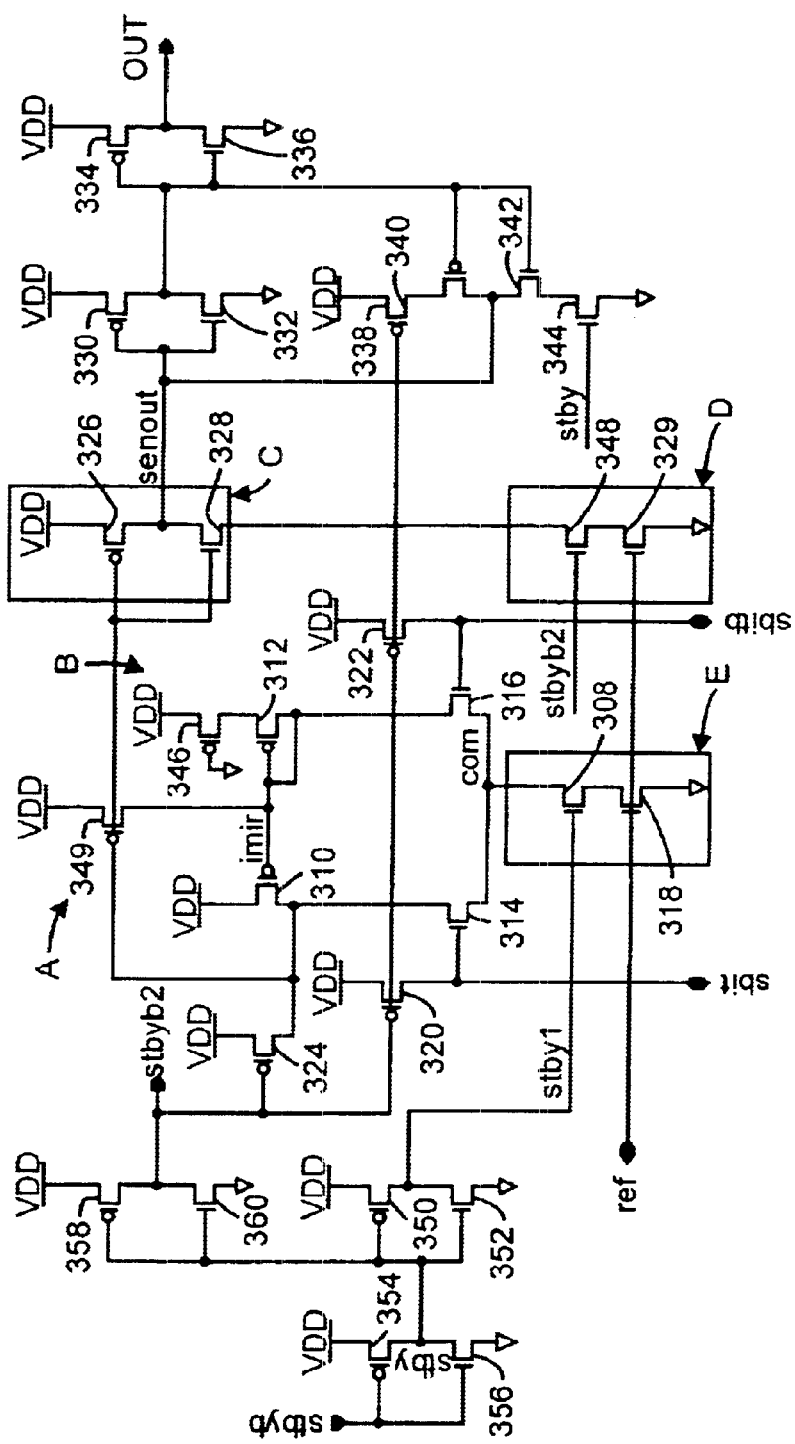
FIG. 5 illustrates a circuit diagram for a differential analog-style two-stage sense amplifier similar to that illustrated in FIG. 4 in accordance with one embodiment of the present invention.

A circuit diagram of one embodiment of a differential analog-style two-stage sense amp, similar to the differential sense amps 20, 120 and 220 illustrated in FIGS. 1, 2 and 4 is illustrated in FIG. 5. In this illustrated embodiment Sections A–E are illustrated for discussion purposes only. Two sections, designated Sections A and B are adapted to enhance the speed of the differential sense amp (alternatively referred to as amplifier enhancement devices). The differential sense amp operates about 150 picoseconds faster than currently available sense amps due to the transistors of Sections A and B.

In this embodiment, Section A comprises a Pfet transistor 349 which is coupled to VDD; transistors 310, 314, 324 and section C via its gate; and node imir, transistors 310, 312 and 316 via its drain. Similarly, Section B comprises a Pfet transistor 346 which is coupled to VDD; to ground via its gate; and transistor 312 via its drain.

Section A, the first amplifier enhancing device, increases the DC voltage margin to the second stage, thus increasing functional reliability. More specifically, Section A, comprising Pfet transistor 349, enables the output of the first stage of the differential analog-style two-stage sense amp to lower the absolute voltage (in the low state) than similarly known amplifier circuits. Referring to FIG. 5, transistor 349 turns on and tries to pull node imir up. When node imir pulls up, transistor 310 shuts off slightly, ultimately enabling the output of the first stage to fall further (as transistor 310 was put into a higher impedance mode). Enabling the output of the first stage to fall further than previously known amplifiers adds margin to the input of the second stage.

Section B, the second amplifier enhancing device (which improves speed) is comprised of Pfet transistor 346. Transistor 346 (through transistor 312) turns on transistor 310 harder and stronger (than it would otherwise have been), causing transistor 310 to pull up the first stage output faster. Additionally, this "overdriving" of transistor 310 enables transistor 310 to be made smaller, thus lowering the capacitance on the first stage output node, which further improves the sense amp's speed. In effect, adding transistor 346 in line with transistor 312 enables the output of the first stage to transition faster and, when coupled with the benefit provided via transistor 349, adds noise margin to the second stage input. Thus in one embodiment of the present invention, having transistors 346 and 349 reduces effects due to process variation, reduces silicon area (due to transistor 310 shrinking considerably), and increases performance (speed).

It is contemplated that the differential analog-style two-stage state sense amp includes a trip-level-shifted inverter designated Section C. In this embodiment, the trip-level-shifted inverter comprises two transistors, a Pfet transistor 326 and an Nfet transistor 328. Transistor 326 is connected to VDD; transistors 328, 324, 310, 314 and 349 via its gate; and node senout, transistors 328, 330, 332, 342 and 340 through its drain. The trip-level-shifted inverter also includes Nfet transistor 328 which is coupled to node senout and transistors 326, 330, 332, 340 and 342; transistors 326, 324, 310, 314 and 349 through its gate; and transistor 348 through its source. Shifting the second stage trip point higher and lowering the output voltage of the first stage adds operating margin to the sense amplifier.

It is further contemplated that the differential analog-style, two-stage sense amp also includes a power switch section designated Sections D and E. Section D includes two Nfet transistors 348 and 329. Section E includes two Nfet transistors 308 and 318. In one embodiment, Sections D and E turn power off to the sense amp. Nfet transistor 348 is coupled to transistor 328; stbyb2 through its gate; and transistor 329 through its source. Nfet transistor 329 is coupled to transistor 348 and node ref via its gate; and to ground via its source. Nfet transistor 308 is coupled to transistor differential pair 314 and 316 (node com); stbyb1 through its gate; and transistor 318 through its source. Nfet transistor 318 is coupled to transistor 308 and node ref via its gate; and to ground via its source.

The illustrated differential sense amp also requires a voltage reference 218 to establish a constant current. Section E, along with this voltage reference, provides the circuitry necessary to generate the appropriate current for the differential amplifier.

In the illustrated embodiment, the differential analog-style two-stage sense amp includes a first stage sense amp; comprising two Pfet transistors 310 and 312, and two Nfet transistors 314 and 316; and a second stage sense amp, comprising transistors 326, 328, 348 and 329 (Sections C and D). Pfet transistor 310 is coupled to VDD; node imir and transistors 349, 316 and 312 via its gate; and transistors 349, 324, 314 and section C via its drain. Pfet transistor 312 is coupled to transistor 346; node imir, transistors 310, 316, 349 and its own drain via its gate; and to transistors 316, 310, 349 and its own gate via its drain. Nfet transistor 314 is coupled to transistors 310, 349, 324 and Section C; transistors 320 and node sbit through its gate; and node corn; transistors 308 and 316 through its source. Nfet transistor 316 is coupled to transistors 312, 310 and 349; to transistors 322 and node sbitb through its gate; and node corn; transistors 308 and 314 through its source. Transistors 310, 312, 314 and 316, along with the transistors in Section E (308 and 318) amplify the signals input on the sbit and sbitb nodes. The resultant output is passed to the second stage for further amplification.

Transistors 358, 360, 354, 356, 350, 352, 324, 320 and 322 provide the necessary logic to correctly power down the analog-style two-stage sense amp using the standby (stby and/or stbyb) signal(s).

Transistors 330, 332, 334, 336, 338, 340, 342 and 334 form the necessary circuits to perform the correct output logic polarity as well as drive current and (power down) latch function.

Figure 6:
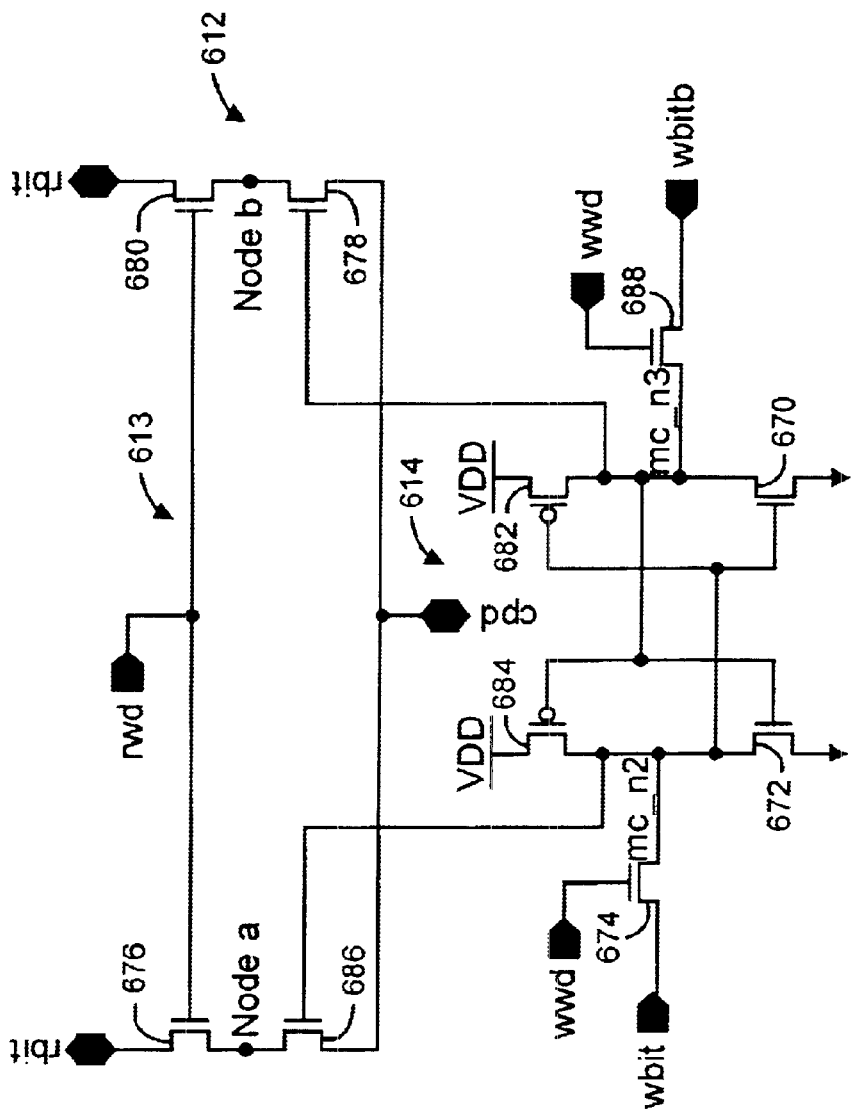
FIG. 6 illustrates a circuit diagram for a memory cell with a read port pair similar to that illustrated in FIG. 4 in accordance with one embodiment of the present invention.

FIG. 6 illustrates one embodiment of a memory cell 612 similar to the register file memory cell 12 and 112 provided previously. In the illustrated embodiment, the memory cell 612 comprises storage portion 614 and read port portion 613. The storage portion comprises two Pfet transistors 684 and 682 and four Nfet transistors 670, 672, 674 and 688. Additionally, the read port portion 613 comprises two read port pairs (dedicated read port(s)) coupled to the 6T storage element 614, rbit and rbitb, where transistors 676 and 686 comprise one read port pair connected or coupled to each other at node a and transistors 680 and 678 comprise a second read port pair connected or coupled to each other at node b. In one embodiment of the present invention, transistors 674 and 688 comprise the dedicated write port pair actuated by a signal on wwd (write wordline) and communicating with wbit and wbitb (the write bitlines). While one embodiment of the present invention includes one read and write port, one, two or more (i.e., a plurality) read and write ports are contemplated.

In one embodiment of the present invention, the transistors in at least one, but generally both, of the read port pairs differ in size. More specifically, transistor 686 is larger than transistor 676 and transistor 678 is larger than transistor 680. In one embodiment of the present invention, transistors 686 and 678 are about equal in size and transistors 676 and 680 are about equal in size, although other embodiments are contemplated where transistors 686 and 678 differ in size although they are still larger than transistors 676 and 680 (which may also differ in size depending on the memory requirements).

Making transistors 686 and 678 larger than transistors 676 and 680 respectively, translates into greater speed for the memory cell. More specifically, having transistors 686 and 678 larger than transistors 676 and 680 respectively, pulls nodes a and b lower than comparable memory cells, creating a bigger gate to source voltage for a given transistor. This increases the current in the selected read port pair, which causes the associated bitline to discharge faster for a given silicon area.

Furthermore, reducing transistors 676 and 680 in size in comparison to similar memory cells also translates into greater speed for the memory cell. More specifically, reducing the size of transistors 676 and 680 reduces capacitance on the associated bitlines. Reducing capacitance on the bitlines in combination with a larger gate-to-source voltage for transistors 676 and 680, increases current per capacitance on the bitlines.

Figure 7:
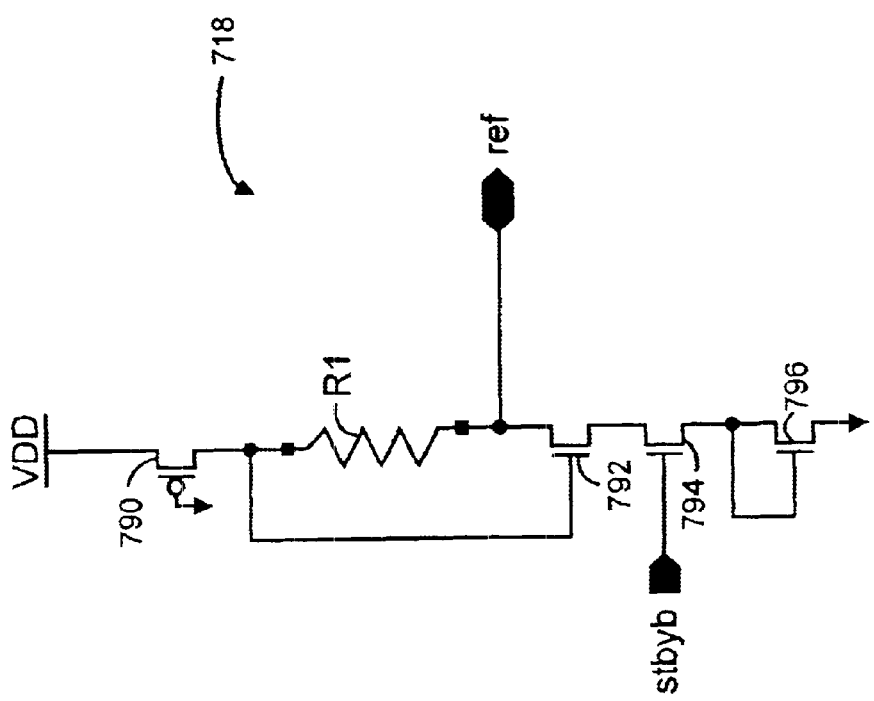
FIG. 7 illustrates a circuit diagram of a voltage reference circuit similar to that illustrated in FIG. 4 in accordance with one embodiment of the present invention.

FIG. 7 illustrates one embodiment of the voltage reference 718 similar to voltage reference 18 and 118 provided previously. The voltage reference 718 includes one Pfet transistor 790 and three Nfet transistors 792, 794, and 796. Transistor 790 is coupled to VDD; ground via its gate; and to resistor R1 and transistor 792 through its drain. Transistor 792 is coupled to resistor R1 and node ref; the other side of resistor R1 and transistor 790 through its gate; and transistor 794 through its source. Transistor 794 is coupled to transistor 792; node stbyb through its gate; and transistor 796 through its source. Transistor 796 is coupled to transistor 794 and its gate; transistor 794 and itself through its gate; and to ground via its source.

The pull-up & column mux (similar to the pull-up and column mux 124 illustrated in FIG. 2) is adapted to manipulate a non-performance optimized logical memory array into a more practical physical memory array implementation, by selecting one column from a plurality of columns. In other words, the column mux enables a plurality of columns to share outputs, where at least one column may be selected from the plurality of columns. If the plurality of columns did not share outputs, each column would require its own output.

Figure 8:
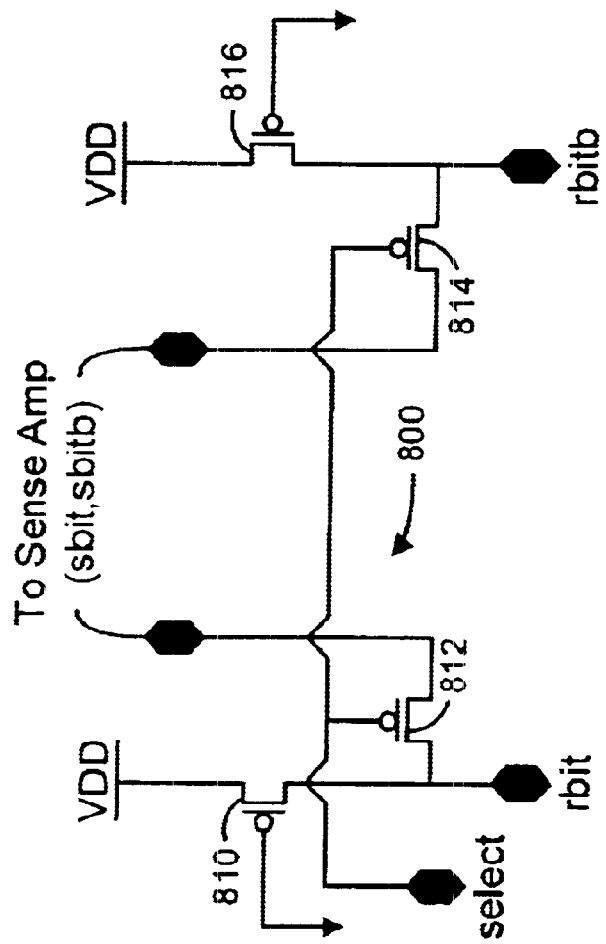
FIG. 8 illustrates a circuit diagram of a pull up & column mux similar to that illustrated in FIG. 4 in accordance with one embodiment of the present invention.

FIG. 8 represents one embodiment of the circuitry that may be used to implement column muxing capability. This column mux circuit 800 is located conceptually between the register file memory cells and the differential sense amp. The illustrated column mux circuit 800 illustrates only one example of column muxing. In this embodiment, the circuit includes four Pfet transistors 810, 812, 814 and 816. Transistors 812 and 814 are coupled to and controlled by the column mux & standby control circuitry through their gate and labeled "select" in this Figure (similar to the column mux & standby control 226 illustrated in FIG. 4); to the differential sense amp through their drains; while their sources are separately connected to rbit and rbitb.

As should be apparent from the previous discussion and the figures, the number of column mux circuits is generally dependent on the number of columns. If the memory only employs one or two columns, a column mux circuit is not employed. However, the use of a column mux is more applicable to shift memories with many words and few bits per word into a physical array with fewer rows and more columns.

In one embodiment of the present invention, the pull-ups are all active all the time, pulling up the bitlines. One of the addresses (designated R1, R2 and R3) in FIG. 4 is selected. While only three addresses (wordlines) are illustrated, a plurality of addresses (wordlines) are contemplated. Selecting one of the wordlines effectively selects one side or the other of the storage element in each selected column.

Current will flow through the left side or right side of the memory cell read ports and then through a pull-up transistor based on the data stored or recorded in the storage element. The data is transmitted through the column mux to the input of the first stage of the sense amp. The output of the first stage is transmitted to the second stage input. Finally, the second stage output is communicated to the latched output circuitry where the memory presents the newly accessed data.

Figure 9:
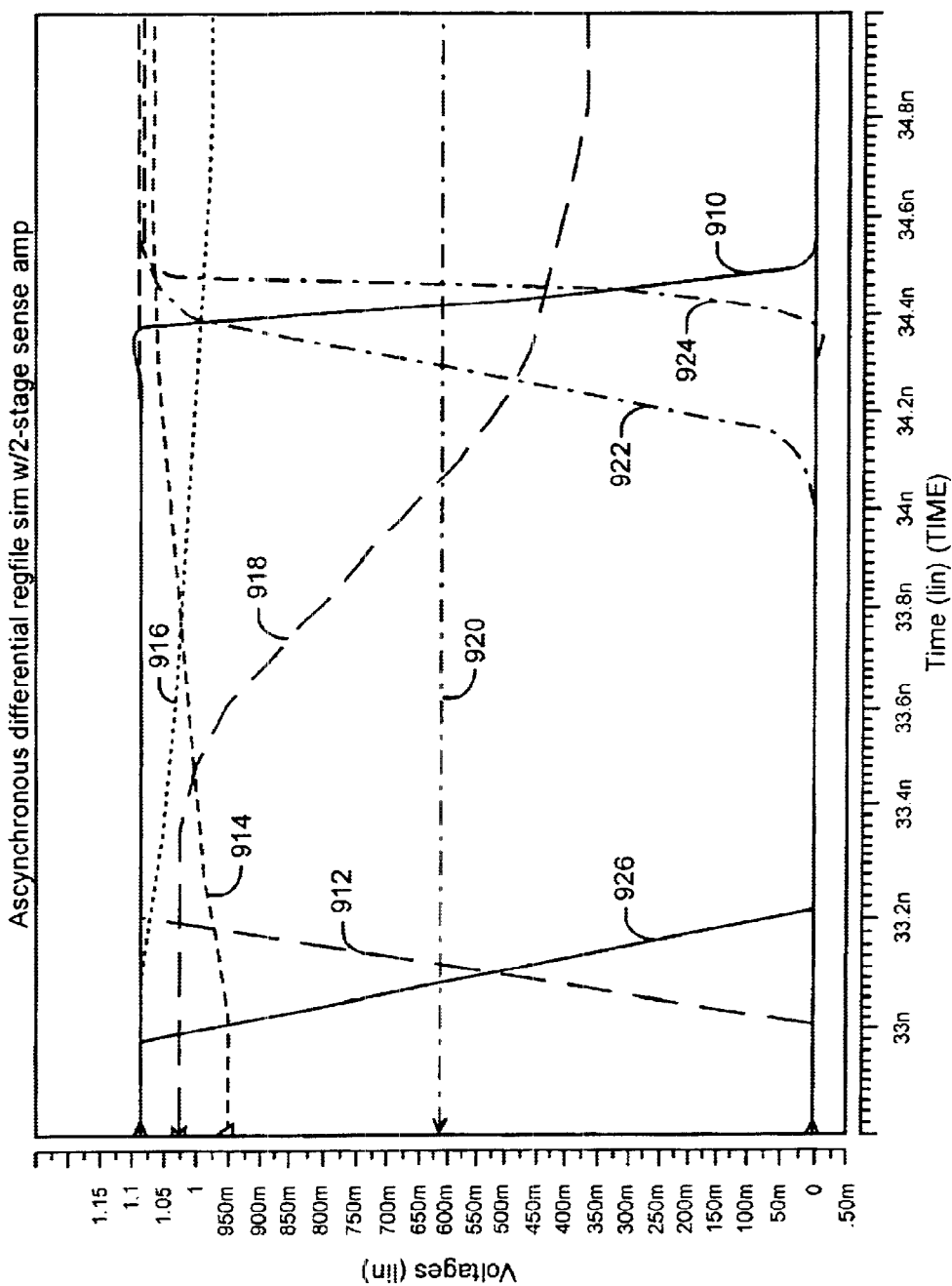
FIG. 9 illustrates a graph depicting the wave forms for the read path used in accordance with one embodiment of the present invention.

Waveforms of one embodiment of the read path are illustrated in FIG. 9. The large dashed line 912 represents the voltage change for a selecting address over time. During a read cycle, the voltage waveforms of 912 switches as does the deselecting address depicted by solid line 926. In one embodiment, the selected address line (912 for example) goes high as the deselected address line (926 for example) goes low. This begins the read cycle at about 33.1 nanoseconds as shown. This new address selection (more specifically the selection of one wordline and the deselection of another wordline) causes a series of events to begin.

The short dashed line 914 represents the voltage change for rbit over time while its counterpart short dashed line 916 (rbitb) can be seen operating differentially with about 140 millivolts of swing. In one embodiment, one of the bitlines goes high (rbit for example as illustrated by line 914) while the voltage on the other bitline goes low (rbitb for example as illustrated by line 916).

The alternating large and small dashed line 920 represents the voltage of the trip point for the second stage of the sense amp. The trip-level-shifted inverter shifts the trip point up in comparison to a standard logic inverter. In this embodiment and at this simulated operating point, the trip level is at about 620 millivolts. Large dashed line 918 represents the output of first stage (and the input to the second stage) of the sense amp, which is shifted down (increasing the margin on the low side) as provided previously. The voltage change on the bitlines (rbit and rbitb represented by lines 914 and 916) causes the voltage on 918 to change (drop), crossing the voltage-shifted trip-level of the second stage amplifier.

The alternating large and small dashed lines 922 and 924 respectively represent the voltage change for senout and the output of the memory over time. Of course, similar operation will occur in the opposite direction, where the opposite data state is read from the memory contents.

While only one sense amplifier 20, 120 is illustrated, any number of sense amplifiers is contemplated, depending on the number of output channels, where one sense amplifier is employed for each output channel. It should be appreciated that there is a physical memory array and a logical memory array. The physical memory array is denoted by the terms rows and columns while the logical memory array uses the terms "words" and "bits per word". The number of bits per word determines the number of output channels and hence the number of sense amplifiers 20, 120. Bits per word and output channels have a one to one correlation. For example, if a particular memory has 16 bits per word, it has 16 outputs and therefore 16 sense amplifiers. Column muxing enables one to manipulate a non-performance optimized logical memory array into a more practical physical memory array implementation.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A multi-port register file memory, the memory comprising:
   at least one storage element;
   at least one read port coupled to said storage element, said read port comprising a pair of transistors, wherein at least one transistor of said pair is larger with respect to another transistor of said pair; and
   a differential sensing device coupled to at least said read port and adapted to sense a predefined voltage swing.

2. The register file memory of claim 1, wherein the register file memory operates asynchronously.

3. The register file memory of claim 1, wherein the register file memory operates synchronously.

4. The register file memory of claim 1, wherein said voltage swing is at least a portion of the total voltage supply.

5. The register file memory of claim 4, where said voltage swing is about 100 millivolts typically.

6. The register file memory of claim 1, wherein said voltage swing is defined relative to a top rail of a voltage supply.

7. The register file memory of claim 1, wherein said differential sensing device is a two-stage analog-style sense amplifier.

8. The register file memory of claim 7, wherein said two-stage analog-style sense amplifier includes at least one amplifier enhancing device.

9. The register file memory of claim 7, wherein said two-stage analog-style sense amplifier includes at least one trip-level-shifted inverter device.

10. The register file memory of claim 7, wherein said two-stage analog-style sense amplifier includes at least one power switch device adapted to turn off power to said two-stage analog-style sense amplifier.

11. The register file memory of claim 7, wherein said two-stage analog-style sense amplifier includes a voltage reference device.

12. A multi-port register file memory, the memory comprising:
   at least one storage element;
   at least one read port coupled to said storage element; and
   a differential sensing device coupled to at least said read port and adapted to sense a predefined voltage swing, wherein said differential sensing device is a two-stage analog-style sense amplifier including a voltage reference device.

13. A multi-port register file memory adapted to be used in applications where a power supply of less than about 1.08 volts occurs, the memory comprising:

at least one memory cell;

a differential sensing circuit adapted to sense a small voltage swing;

a voltage reference device coupled to said differential sensing circuit; and a latched output coupled to differential sensing device.

14. The memory device of claim 13, wherein said memory cell includes at least one storage element.

15. The memory device of claim 13, wherein said memory cell further includes two read port pairs coupled to said storage element.

16. The memory device of claim 15, wherein each of said read port pairs includes two transistors of different sizes.

17. The memory device of claim 13, wherein said differential sensing circuit includes two amplifier enhancing devices.

18. The memory device of claim 13 including more than one write port.

19. The memory device of claim 13 including more than one read port.

20. A multi-port register file memory adapted to be used in applications where a power supply of less than about 1.08 volts occurs, the memory comprising:

a plurality of storage elements arranged in a plurality of rows and columns;

at least one read port and one write port coupled to each of said storage elements;

a differential sensing device adapted to sense a small voltage swing;

a voltage reference device coupled to said differential sensing device; and a latched output circuit coupled to differential sensing device.

21. A multi-port register file memory, the memory comprising:

a plurality of storage elements arranged in rows and columns;

means for selecting one of said storage elements; and means for differentially sensing a small bitline voltage swing using a two-stage analog-style sense amplifier including at least one trip-level-shifted inverter device.

22. A method for improving speed and increasing performance in a multi-port register file memory having a plurality of storage elements, the method comprising:

selecting at least one of the storage elements; and differentially sensing a small voltage swing using a two-stage analog-style sense amplifier including at least one trip-level-shifted inverter device.

23. A method for reading data stored in a multi-port register file memory having a plurality of storage elements arranged in rows and columns, the method comprising:

selecting one of the storage elements;

flowing a current through at least one transistor of the memory cell in the selected storage element;

causing an output of a sense amplifier having at least one trip-level-shifted inverter device and connected to at least one of said selected memory cells to switch accessed data to full CMOS logic levels.

24. A multi-port register file memory, the memory comprising:

at least one storage element;

at least one read port coupled to said storage element; and a differential sensing device coupled to at least said read port and adapted to sense a predefined voltage swing, wherein said differential sensing device is a two-stage analog-style sense amplifier including at least one trip-level-shifted inverter device.

25. A multi-port register file memory, the memory comprising: at least one storage element; at least one read port coupled to said storage element; and a differential sensing device coupled to at least said read port and adapted to sense a predefined voltage swing, wherein said differential sensing device is a two-stage analog-style sense amplifier including at least one power switch device adapted to turn off power to said two-stage analog-style sense amplifier.

* * * * *